United States Patent
Sato et al.

(10) Patent No.: US 6,639,927 B2
(45) Date of Patent: Oct. 28, 2003

(54) SURFACE EMITTING SEMICONDUCTOR LASER, AND ITS FABRICATION METHOD

(75) Inventors: Takahiro Sato, Kanagawa (JP); Hajime Sakata, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 9 days.

(21) Appl. No.: 09/749,820

(22) Filed: Dec. 28, 2000

(65) Prior Publication Data

US 2001/0006528 A1 Jul. 5, 2001

(30) Foreign Application Priority Data

Dec. 28, 1999 (JP) .......................................... 11-371978
Oct. 27, 2000 (JP) ........................................ 2000-328168

(51) Int. Cl.[7] .............................. H01S 5/06; H01S 5/18; H01S 5/22
(52) U.S. Cl. ............................. 372/46; 372/36; 372/50; 372/96
(58) Field of Search .............................. 372/46, 96, 36, 372/50

(56) References Cited

U.S. PATENT DOCUMENTS 5,359,618 A * 10/1994 Lebby et al. ................. 372/96
6,014,400 A * 1/2000 Kobayashi ................... 372/96

FOREIGN PATENT DOCUMENTS

JP         7-38196      2/1995
JP         10-294528    11/1998

* cited by examiner

*Primary Examiner*—James Davie
(74) *Attorney, Agent, or Firm*—Fitzpatrick, Cella, Harper & Scinto

(57) ABSTRACT

A surface emitting semiconductor laser includes an active region formed on a growth substrate, upper and lower mirror layers that sandwich the active region to construct a vertical cavity, a selective oxidization layer, and a current injecting unit for injecting a current into the active region. The selective oxidization layer is selectively oxidized and insulated and is provided on the side of the active region opposite to the side of the substrate. In this structure, a post portion is formed by removing semiconductor material formed on the substrate down to an uppermost or halfway level of the selective oxidization layer while the selective oxidization layer is used as an etch stop layer, and the selective oxidization layer acts as both a current confinement layer for the current injection and an insulating layer for the current injecting unit.

13 Claims, 10 Drawing Sheets

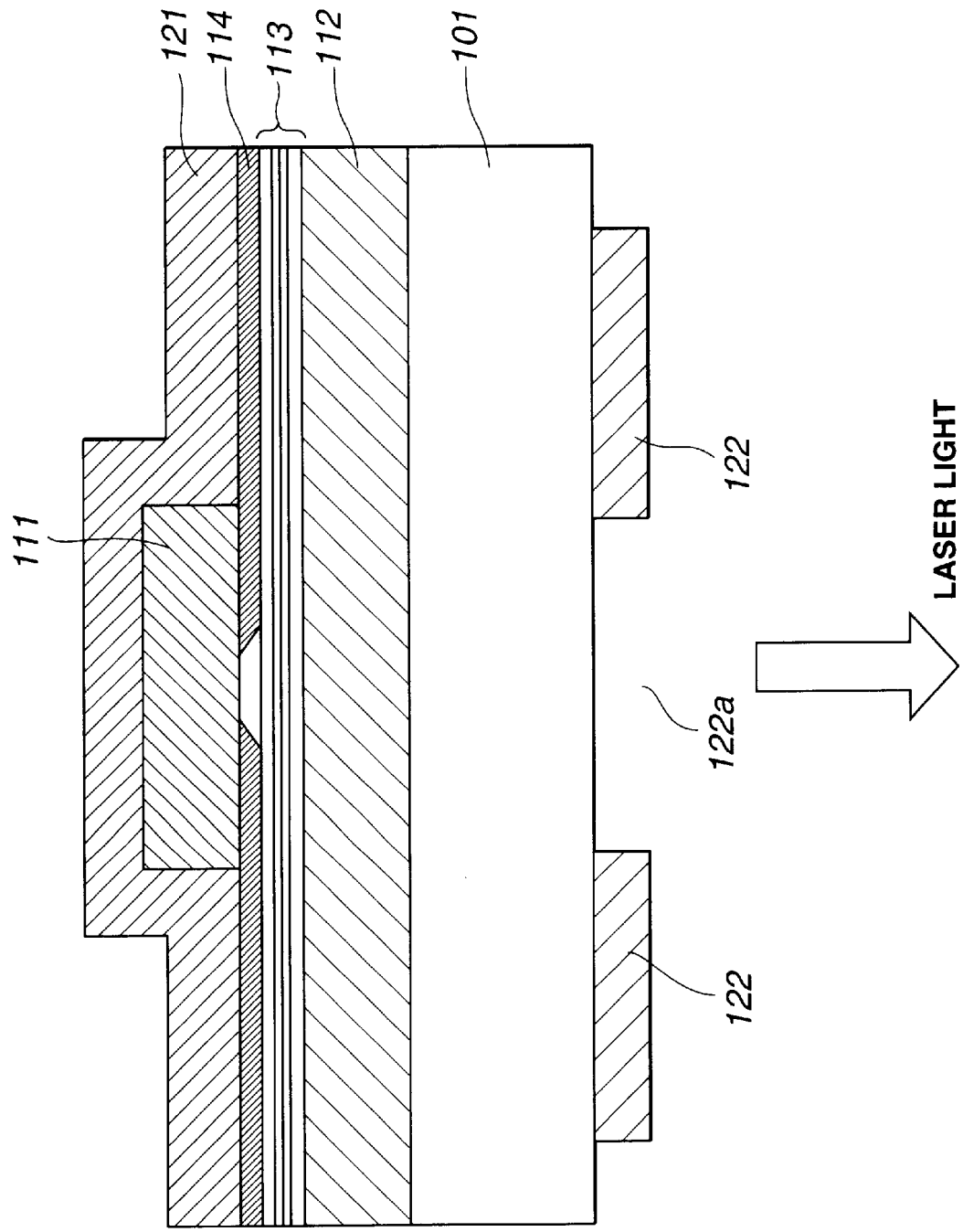

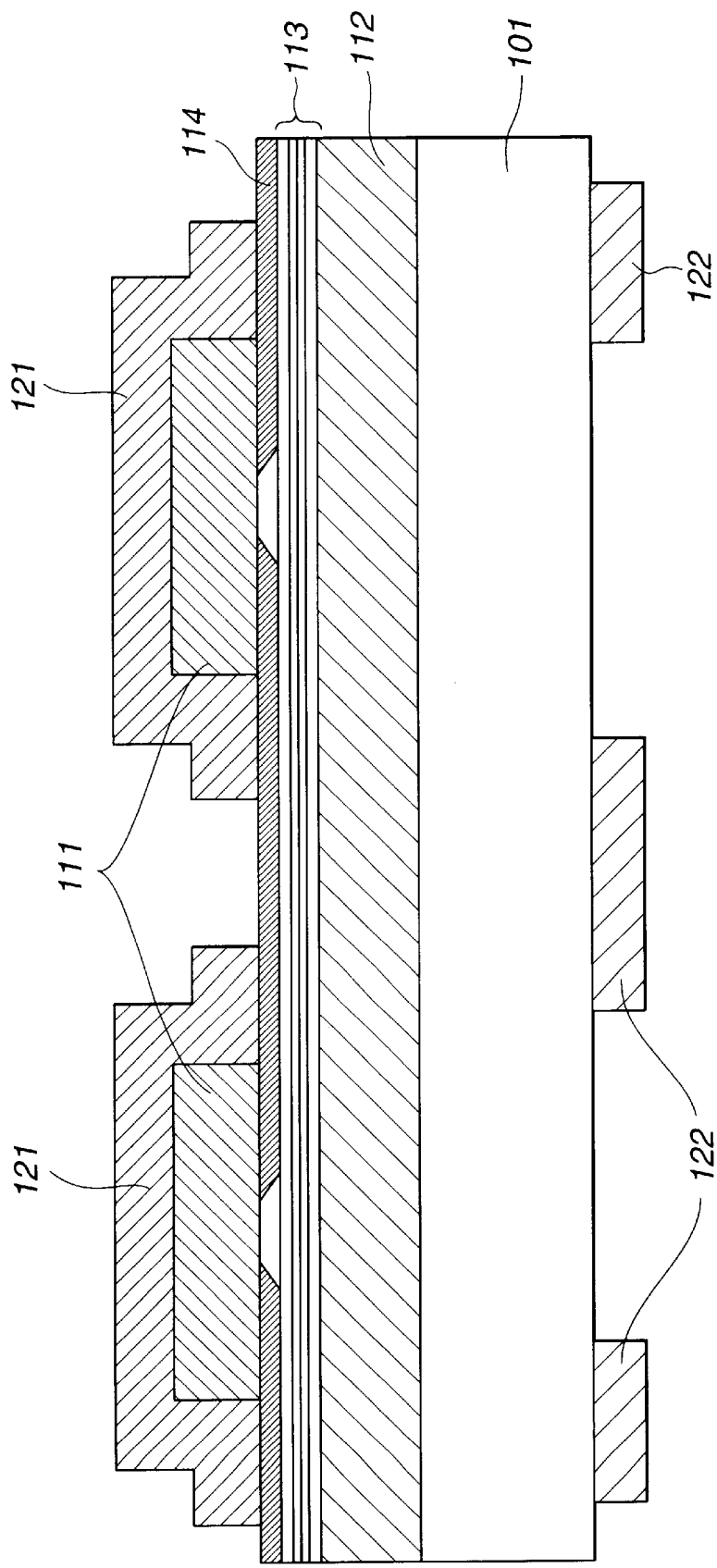

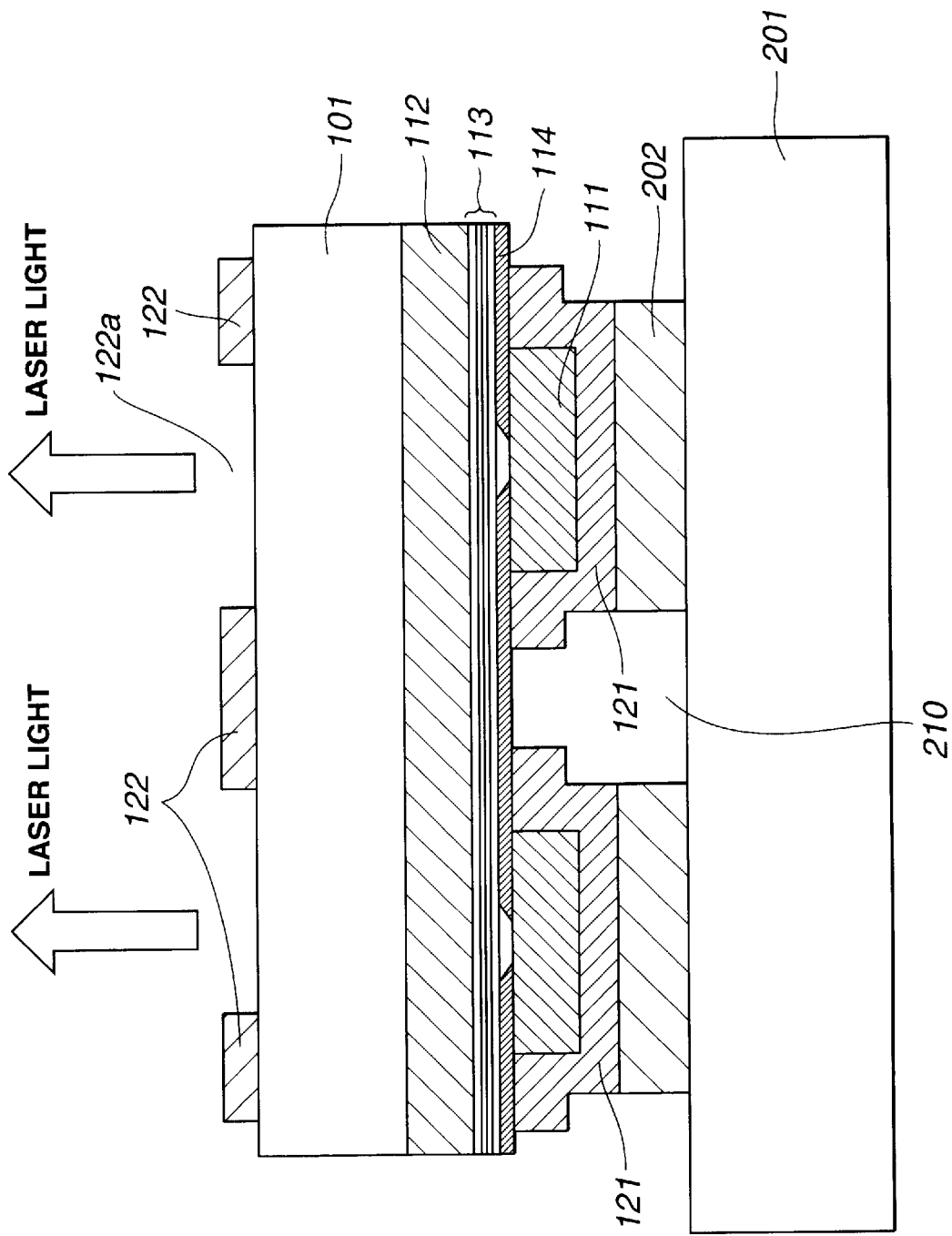

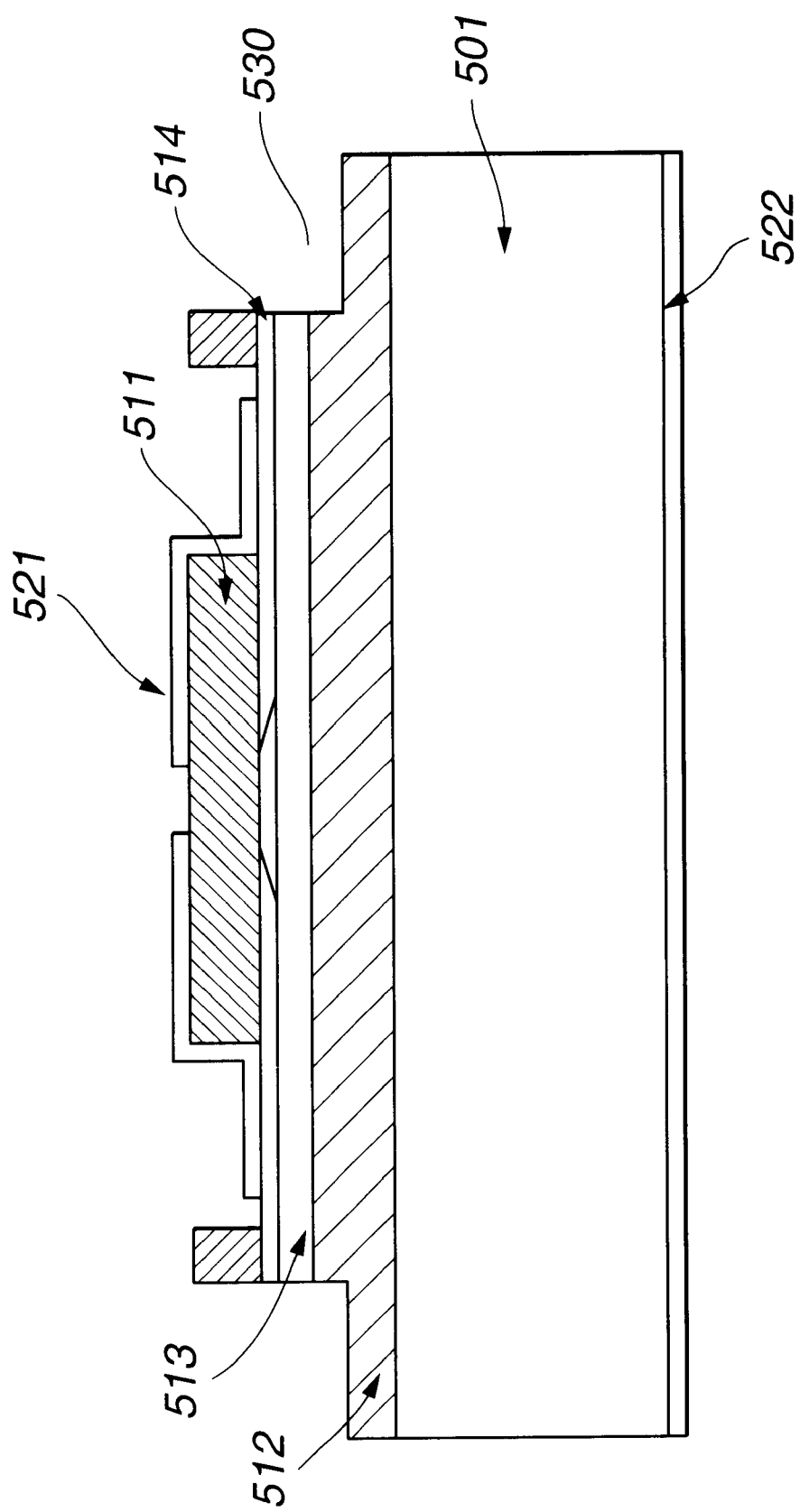

SURFACE EMITTING SEMICONDUCTOR LASER, AND ITS FABRICATION METHOD

BACKGROUND OF THE INVENTION

1. Field of the Invention

This invention relates to a surface emitting semiconductor laser with a current confinement structure for confining a current into a restricted active region, which can be suitably used in optical information communications, optical information processing apparatuses, and recording apparatuses such as laser beam printers. This invention also relates to its fabrication method.

2. Related Background Art

A surface emitting semiconductor laser has been marked with keen interest as a light source in optical information communications and processing, and its development has been energetically advanced. The surface emitting semiconductor laser can be characterized by low electric power consumption, low threshold current, two-dimensional dense integration capability, and dynamic single mode operation.

A conventional surface emitting semiconductor laser is illustrated in FIG. 1. The laser is fabricated as follows. A p-type GaAs/AlGaAs multi-layer mirror 11 is etched into a mesa shape, and sides of the mesa mirror 11 are filled with insulating material such as polyimide 4. An anode electrode 21 is then formed as illustrated in FIG. 1. In FIG. 1, there are further formed an n-type GaAs/AlGaAs multi-layer mirror 12, an InGaAs/GaAs active region 13, a layer 14 which is selectively oxidized except for its central portion which is not oxidized, and a cathode electrode 22 formed on the bottom face of an n-type GaAs substrate 1.

In the device of the above configuration, however, its thermal resistance increases since the sides of the mesa are surrounded by the insulating material 4 having high thermal resistance. Further, the area of the electrode 21 is very small due to a very small device size, and its contact resistance is large. Thus, thermal characteristics of this device are not preferable, and its oscillation wavelength is therefore likely to shift when the device is driven. In addition, its serial electrical resistance is large, and its consumption electric power hence increases.

The following surface emitting semiconductor laser is proposed in Japanese Patent Application Laid-Open No. 7(1995)-38196 to solve the above problem. In this laser, sides of an active layer and other layers exposed by etching are covered with a material having high electrical resistance and high thermal conductivity, and those sides are surrounded by a metal to reduce its thermal resistance. Thus, an additional process is needed in this fabrication process to form a region with high electric resistance and large thermal conductivity on the side wall.

As a technique for improving the performance of a surface emitting semiconductor laser, there also exists the technique in which an AlAs layer inserted in a semiconductor multi-layer mirror is partially oxidized to form the current confinement structure. In this technique, sides of the semiconductor multi-layer mirror are exposed by dry etching, and the exposed sides are then heat-treated in water vapor. The AlAs layer is thus oxidized to a desired width in an in-plane direction (a direction perpendicular to a layering direction) with its central portion being left as is, and an insulation layer is partially formed in the AlAs layer to fabricate the current confinement structure.

Further, there exists the technique for utilizing an AlAs layer as an etch stop layer, which is disclosed in Japanese Patent Application Laid-Open No. 10(1998)-294528. In this technique for fabricating a surface emitting semiconductor laser, dry etching is conducted using an etching gas whose etching rate is low for AlAs. When the AlAs layer is used as an etch stop layer, over-etching of the AlAs layer can be prevented, and exposure of an active layer can be hence prevented. The exposure of the active layer is likely to lead to a decrease in radiation efficiency due to damage to the active layer. Accordingly, this technique is very effective and valuable.

In this technique wherein the AlAs layer is used as an etch stop layer, a mixed gas with a high etching rate for a GaAs layer and a low etching rate for an AlAs layer is used, but a ratio of etching rates between GaAs and AlAs can be sufficiently controlled by changing conditions, such as a vacuum degree, even with a conventional etching which uses a fluorine gas. Further, there is no disclosure that an oxidized AlAs layer is used as an insulating layer between p-type and n-type layers, in Japanese Patent Application Laid-Open No. 10(1998)-294528.

SUMMARY OF THE INVENTION

It is an object of the present invention to provide a surface emitting semiconductor laser whose thermal characteristic can be readily improved, whose electrical resistance can be readily reduced, whose electric power consumption for driving can be readily lowered, whose threshold current can be readily reduced, which can be fabricated by a relatively simple process, which can be readily arrayed, and which can be readily provided with a current confinement structure; and its fabrication method. This object is achieved by effectively utilizing a selective oxidization layer. (As used herein, selective oxidization layer refers to either a selective oxidizable layer that is not yet oxidized or a selective oxidized layer that is already oxidized, or both, according to contex.)

It is another object of the present invention to provide a surface emitting semiconductor laser with a built-in current confinement structure, whose fabrication yield can be readily improved by effectively utilizing a selective oxidization layer (e.g., $Al_xGa_{1-x}As$ layer (typically $0.8 \leq x \leq 1$)), that is already oxidized, as an etch stop layer; and its fabrication method.

The present invention is generally directed to a surface emitting semiconductor laser which includes an active region formed on a growth substrate; upper and lower mirror layers that sandwich the active region to construct a vertical cavity; a selective oxidization layer that is selectively oxidized and insulated and that is provided on the side of the active region opposite to the side of the substrate; and a current injecting unit for injecting a current into the active region. In this structure, a post portion is formed by removing semiconductor material formed on the substrate down to an uppermost or halfway level of the selective oxidization layer while the selective oxidization layer is used as an etch stop layer, and the selective oxidization layer is formed to act as both a current confinement layer for current injection and an insulating layer for the current injecting unit.

In this structure, p-type semiconductor is insulated from n-type semiconductor by the selective oxidization layer, except for a portion of a current, or devices are insulated from each other by the selective oxidization layer when a plurality of surface emitting semiconductor lasers are arrayed. Accordingly, there is no need to separately form an insulating layer, and the fabrication process can be hence simplified. Further, the current confinement structure can be formed by the selective oxidization layer, and a contact area between the semiconductor layer and an electrode metal of the current injecting unit can be enlarged. Therefore, thermal characteristic can be improved, series electrical resistance can be reduced, electric power consumption for driving can be lowered, and threshold current can be reduced.

The selective oxidization layer is typically composed of semiconductor including aluminum which is selectively or partially oxidized. The Al mole fraction of the selective oxidization layer can be changed with a desired distribution along a direction perpendicular to the substrate. The oxidization rate increases as the Al mole fraction increases. Thereby, a slope of the refractive index can be created in the selective oxidization layer, and the selective oxidization layer can act as a kind of lens. The light density in the active region is thus increased, and the threshold current is further reduced.

When the post portion is formed by removing the semiconductor material down to the uppermost level of the selective oxidization layer while the selective oxidization layer after selective oxidizing treatment is used as an etch stop layer, the oxidization width in an in-plane direction of the selective oxidization varies little per fabrication lot. Further, the selective ratio between the etch stop layer and the semiconductor material is increased, and therefore, etching can be stopped exactly at the uppermost level of the already-oxidized selective oxidization layer.

When the Al mole fraction of the selective oxidization layer is changed with a desired distribution along the direction perpendicular to the substrate, loss due to diffracted light in the current confinement layer can be reduced.

The growth substrate may be left untouched or may be entirely or partially removed. When the substrate is removed, oscillation light is not blocked by the substrate. The laser is therefore adaptable to a wide range of oscillation wavelengths. In this case, the current injection unit can be comprised of a metal formed on the top and sides of the upper mirror layer on the side of the active region opposite to the side of the substrate, which are exposed due to formation of the post portion, and a metal formed on a bottom of the lower mirror layer exposed by the removal of the substrate. Accordingly, the heat radiation characteristic of the device can be further improved. Further, cross-talk between arrayed devices can be reduced.

The upper and lower mirror layers are typically composed of semiconductor multi-layer mirrors. When the substrate is removed, the upper mirror layer can be a semiconductor multi-layer mirror while the lower mirror layer can be a metal mirror formed on a face exposed by the removal of the substrate.

When the top and sides of the upper mirror layer on the side of the active region opposite to the side of the substrate are covered with the electrode metal of the current injecting unit, current injection and heat dispersion can be effected through those sides as well. Therefore, the electrical resistance can be lowered, and the thermal conductivity can be enhanced in such a structure. The heat radiation characteristic can be further increased by thickening that electrode metal.

The current injection unit may be comprised of a metal formed on the top and sides of the upper mirror layer on the side of the active region opposite to the side of the substrate, which are exposed due to formation of the post portion, and a metal formed on a bottom of the substrate. Alternatively, the current injection unit may be comprised of a metal formed on the top and sides of the upper mirror layer on the side of the active region opposite to the side of the substrate, which are exposed due to formation of the post portion, and a metal formed on a bottom of the lower mirror layer (in the case where the substrate is removed). Still also the current injection unit may be comprised of a metal formed on the top and sides of the upper mirror layer on the side of the active region opposite to the side of the substrate, which are exposed due to formation of the post portion, and a metal formed on the top of the substrate exposed by the partial removal of the layers on the substrate. Further, the current injection unit may be comprised of a metal formed on the top and sides of the upper mirror layer on the side of the active region opposite to the side of the substrate, which are exposed due to formation of the post portion, and a metal formed on the lower mirror layer exposed by the partial removal of the layers on the substrate.

The active region can be comprised of quantum well semiconductor layers or the like.

When a plurality of surface emitting semiconductor lasers are arrayed on the substrate, the selective oxidization layer can act as an insulating layer for electrically separating the surface emitting semiconductor lasers from each other as well. The surface emitting semiconductor lasers can be arrayed with high density since the laser with the above structure has excellent heat radiation efficiency and thermal characteristics.

The surface emitting semiconductor laser can be bonded on a heat sink. Thereby, the thermal characteristics can be further improved. In this case, the surface emitting semiconductor laser is typically bonded on the heat sink with the upper mirror layer being on the side of the heat sink.

An electric wiring may be formed on the heat sink, and the electric wiring may be connected to a metal of the current injection unit formed on the upper mirror layer. In this case, a gold layer can be provided on the metal of the current injection unit formed on the upper mirror layer, and the electric wiring can be connected to the metal through the gold layer.

The present invention is also directed to a method of fabricating the above surface emitting semiconductor laser which includes the steps of growing semiconductor material on the substrate; partially removing the semiconductor material on the substrate down to an uppermost or halfway level of the selective oxidization layer while the selective oxidization layer prior to selective oxidizing treatment is used as an etch stop layer; and selectively oxidizing the selective oxidization layer to form a current confinement layer for the current injecting unit. In this fabrication method, an insulating layer for separating p-type and n-type layers from each other except a current can be formed as a result of formation of the current confinement layer. Therefore, no new insulating layer needs to be formed, and the fabrication process can be hence simplified.

Further, the present invention is also directed to a method of fabricating the above surface emitting semiconductor laser which includes the steps of growing semiconductor material on the substrate; forming a groove for partially oxidizing the selective oxidization layer; selectively oxidizing the selective oxidization layer to form a current confinement layer for the current injecting unit utilizing the groove; and partially removing the semiconductor material on the substrate down to an uppermost level of the selective oxidization layer while the selective oxidization layer after the selective oxidizing treatment is used as an etch stop layer. Also in this fabrication method, an insulating layer for separating p-type and n-type layers from each other except a current can be formed as a result of formation of the current confinement layer. Therefore, no new insulating layer needs to be formed, and the fabrication process can be hence simplified. In addition, the etch stop by the etch stop layer can be precisely achieved, and the fabrication yield can be hence improved. The groove is typically formed by etching the upper mirror layer, the selective oxidization layer prior to selective oxidizing treatment, and the active region down to the uppermost or halfway level of the lower mirror layer.

The selective oxidization layer is typically composed of $Al_xGa_{1-x}As$ ($0.8 \leq x \leq 1$) formed in the vicinity of the active region. The fabrication method may further include a step of covering the top and sides of the upper mirror layer on the side of the active region opposite to the side of the substrate, which are exposed by the partial removing step, with a metal of the current injection unit.

These and other advantages will be more readily understood in connection with the following detailed description of the more preferred embodiments in conjunction with the drawings.

BRIEF DESCRIPTION OF THE DRAWINGS

FIG. 2 is a cross-sectional view taken along a cavity extending direction, illustrating a first embodiment of a surface emitting semiconductor laser according to the present invention.

FIG. 3 is a cross-sectional view taken along a cavity extending direction, illustrating a second embodiment of an array of surface emitting semiconductor lasers according to the present invention.

FIG. 5 is a cross-sectional view taken along a cavity extending direction, illustrating a fourth embodiment of an array of surface emitting semiconductor lasers according to the present invention.

FIG. 7 is a cross-sectional view taken along a cavity extending direction, illustrating a sixth embodiment of a surface emitting semiconductor laser according to the present invention.

DESCRIPTION OF THE PREFERRED EMBODIMENTS

First Embodiment

Figure 1:
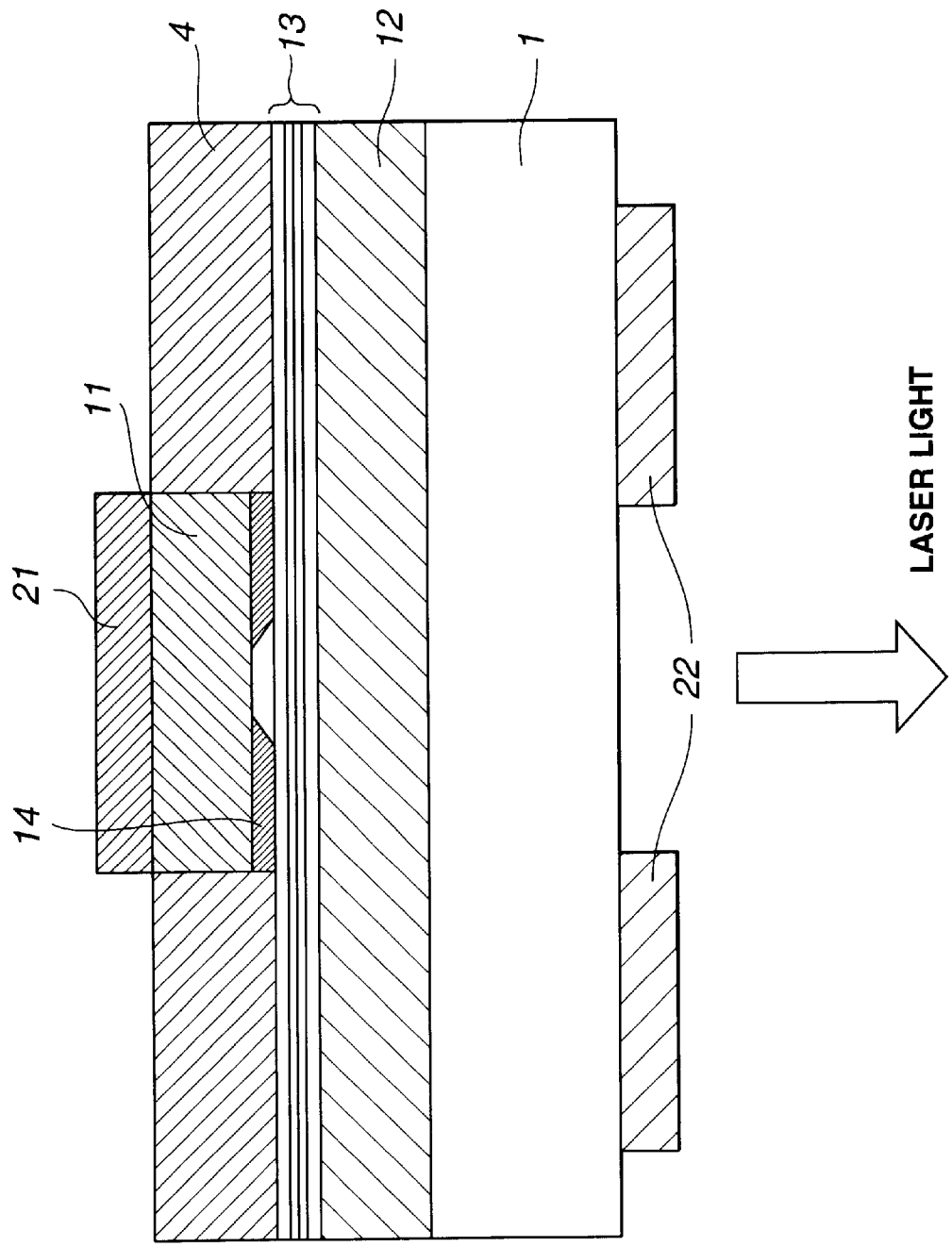
FIG. 1 is a cross-sectional view taken along a cavity extending direction, illustrating a conventional surface emitting semiconductor laser.

FIG. 2 illustrates a cross-section of a first embodiment of a surface emitting semiconductor laser of the present invention. The laser includes an InGaAs/GaAs active region 113, a p-type GaAs/AlGaAs multi-layer mirror 111, and an n-type GaAs/AlGaAs multi-layer mirror 112. The laser can emit light perpendicularly to an n-type GaAs substrate 101.

An AlAs selective oxidization layer 114 is formed on the active region 113, and the oxidization layer 114 is selectively oxidized excluding its central portion. Thus, there is provided in the laser the selective oxidization layer 114 which confines a current in the active region 113 and locally increases a current density to improve an efficiency of the device. The aluminum mole fraction of the selective oxidization layer 114 changes along a direction perpendicular to the substrate 101 such that the refractive index of the layer 114 is perpendicularly distributed to create a lens effect. Hence, light density in the active region 113 is locally increased, and a threshold current of the laser is reduced. The distribution of the aluminum mole fraction can be appropriately determined as appropriate. The distribution may be monotonously slanted or may be maximized at its central portion, for example.

In this embodiment, upper and side portions of the mesa of the p-type mirror 111 are covered with a metal of an anode electrode 121, so that a contact area between the mesa and the metal of the electrode 121 is made larger than a conventional structure. The serial electrical resistance of the device is thus decreased, and heat radiation capability in the device is enhanced. Laser light is emitted through the n-type mirror 112 and the n-type substrate 101 since the p-type mirror 111 is covered with the anode electrode 121. The oscillation wavelength of the surface emitting laser of this embodiment is 0.98 µm, which can transmit through the GaAs substrate 101.

A method of fabricating the laser illustrated in FIG. 2 will be described. The n-type GaAs/AlGaAs multi-layer mirror 112, InGaAs/GaAs active region 113, AlAs selective oxidization layer 114, and p-type GaAs/AlGaAs multi-layer mirror 111 are grown in this order on the n-type GaAs substrate 101. A 0.98 µm-wavelength surface emitting laser can be thus fabricated. Here, the AlAs selective oxidization layer 114 is grown such that its Al mole fraction is gradually altered from AlGaAs (lowermost portion) to AlAs (uppermost portion), for example.

The mesa is then formed by etching the wafer from the p-type mirror 111 down to a halfway or uppermost point of the selective oxidization layer 114. Reactive ion beam etching (RIBE) using fluorine gas is employed here.

The selective oxidization layer 114 is selectively oxidized in water vapor to form the current confinement structure. In FIG. 2, the cross-hatched portion of the layer 114 indicates an oxidized portion. The oxidized region in the in-plane direction of the thus-formed selective oxidization layer 114 can be controlled by the duration of the vapor oxidizing treatment. Here, the Al mole fraction of the selective oxidization layer 114 is monotonously changed, so that the refractive index of the layer 114 is also monotonously sloped. Accordingly, the selective oxidization layer 114 can act as a kind of a lens, and light density is hence increased in the active region 113. Thus, a low-threshold semiconductor laser can be achieved.

Electrodes 121 and 122 are then formed by electron beam (EB) deposition. The anode electrode 121 is formed of Cr/Au, and the cathode electrode 122 is formed of AuGe/Au. A lift-off method is used in a process of forming the electrodes. A light transmitting window 122a is formed in the cathode electrode 122. Further, the thickness of the electrode may be increased by using a material with high thermal conductivity, such as gold (Au), such that heat radiation characteristics in the device's lateral direction can be sufficiently improved. The thickness of the electrode can be increased by vapor deposition or electroless plating.

The anode electrode 121 formed on the p-type mirror 111 also has the function of a metal mirror. Thereby, the layer number of the p-type multi-layer mirror 111 can be reduced. Thus, the serial electrical resistance of the device is lowered, and the electric power consumption can be hence reduced. The serial resistance can be further reduced since a current can be injected through the sides of the mesa of the p-type multi-layer mirror 111 as well. Additionally, the thermal conductivity is enhanced by the metal electrode 121 covering the top and sides of the p-type multi-layer mirror 111. The thermal characteristic of the device is thus improved.

The structure illustrated in FIG. 2 is constructed such that a 0.98 $\mu$m-wavelength surface emitting laser can be achieved. It is possible, however, to achieve a 0.83 $\mu$m-wavelength surface emitting laser or the like by altering compositions of the active region 113 and the multi-layer mirrors 111 and 112, by entirely or partially removing the n-type GaAs substrate 101, or by using a substrate (e.g., a substrate of AlGaAs) that is transparent to laser light.

Further, it is possible to omit the multi-layer mirror 112 and form a mirror and electrode metal after the substrate 101 is entirely or partially removed. In this case, a light transmitting window is formed in the anode electrode 121.

In the above fabrication process, the growth method is not limited to molecular beam epitaxy (MBE), but a chemical beam growth method or the like can also be used. Further, the active region 113 illustrated in FIG. 2 has a triple quantum well structure, but the structure is not limited thereto. Moreover, GaAs-series material is used as the above material, but the material is not limited thereto.

The distribution of the Al mole fraction in the selective oxidization layer 114 is also not limited to a monotonous slope, and it can vary.

The shape of the mesa viewed from above may take various configurations, such as a circle, a square, and a rectangle. Regarding the etching, the RIBE using fluorine gas is used in the above fabrication method, but other etching methods may be used. Wet etching using a mixed solution of citric acid and hydrogen peroxide can be used, for example. Further, oxidization of the AlAs selective oxidization layer 114 can also be conducted by dipping the wafer into a hydrogen peroxide solution, for example.

With respect to the electrodes, those are formed by the EB vapor deposition in the above fabrication method, but vapor deposition using resistance heating or the like can also be used. Further, the electrode may be formed of Ti/Au (this is used for the anode electrode), Ti/Pt/Au, Pt/Au (these latter two can be used for both the anode and cathode electrodes), or the like. The lift-off method is used as the process of forming the electrode, but the forming process is not limited thereto.

Second Embodiment

FIG. 3 illustrates a cross-section of a second embodiment of a surface emitting semiconductor laser of the present invention. In the second embodiment, a laser array illustrated in FIG. 3 is constructed using surface emitting lasers of the first embodiment. In FIG. 3, portions having the same function as those in FIG. 2 are designated by the same reference numerals as those in FIG. 2.

In the laser array of FIG. 3, the selective oxidization layer 114 also acts as an insulator for electrically separating the devices from each other. Therefore, there is no need for forming an insulating layer of SiN, $SiO_2$, or the like for electric separation by an additional process. As for the other points, each device can be modified as described in the first embodiment.

In the second embodiment, thermal characteristics of the respective devices are excellent, and, therefore, problematic thermal cross-talk between devices is negligible even when the devices are highly densely integrated. Further, electric power consumption of each device is reduced, so that a large number of surface emitting lasers can be integrated.

Third Embodiment

FIGS. 4A to 4D illustrate cross-sections of a third embodiment of a surface emitting semiconductor laser of the present invention. Also in FIGS. 4A to 4D, portions having the same function as those in FIG. 2 are designated by the same reference numerals as those in FIG. 2.

The laser of the third embodiment is fabricated in the following manner.

Figure 4A:
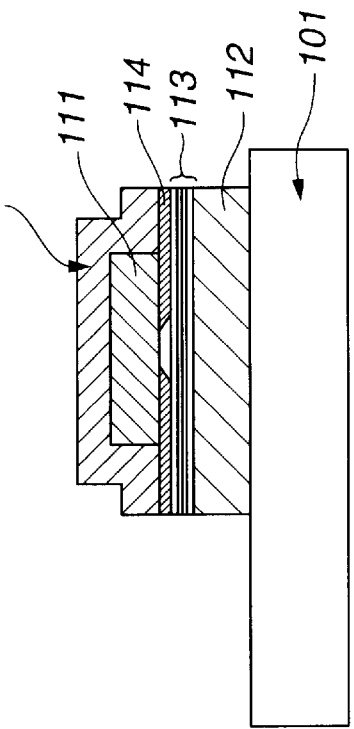
FIGS. 4A to 4D are cross-sectional views taken along a cavity extending direction, illustrating a process of fabricating a third embodiment of a surface emitting semiconductor laser according to the present invention.

Similarly to the first embodiment, n-type GaAs/AlGaAs multi-layer mirror 112, InGaAs/GaAs active region 113, AlAs selective oxidization layer 114, and p-type GaAs/AlGaAs multi-layer mirror 111 are grown on the n-type GaAs substrate 101 in this order by MBE, as illustrated in FIG. 4A. The AlAs selective oxidization layer 114 is grown such that its Al mole fraction is gradually altered from $Al_xGa_{1-x}As$ (0<x<1) (lowermost portion) to AlAs (uppermost portion). The growth substrate is not limited to the n-type GaAs substrate 101. A semi-insulating GaAs substrate, a substrate with a different composition, or the like can also be used.

The mesa is then formed by etching the wafer from the p-type mirror 111 down to a halfway or top point of the selective oxidization layer 114, as illustrated in FIG. 4A. Reactive ion beam etching (RIBE) using fluorine gas is employed.

The selective oxidization layer 114 exposed by the above etching is selectively oxidized in water vapor to form the current confinement structure. The cross-hatched portion of the layer 114 indicates an oxidized portion in FIG. 4A. The oxidized region in the in-plane direction of the thus-formed selective oxidization layer 114 can be controlled by the duration of the vapor oxidizing treatment. The selectively oxidized region can be changed as described in the first embodiment.

Figure 4B:
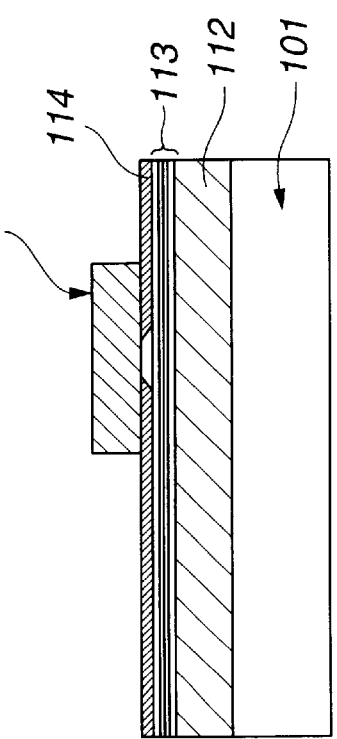

The anode electrode 121 is then formed by electron beam (EB) deposition such that it covers the top and sides of the mesa as illustrated in FIG. 4B. The anode electrode 121 is formed of Cr/Au. The lift-off method is used in the process of forming the anode electrode 121. The anode electrode 121 can also be altered as described in the first embodiment.

Figure 4C:
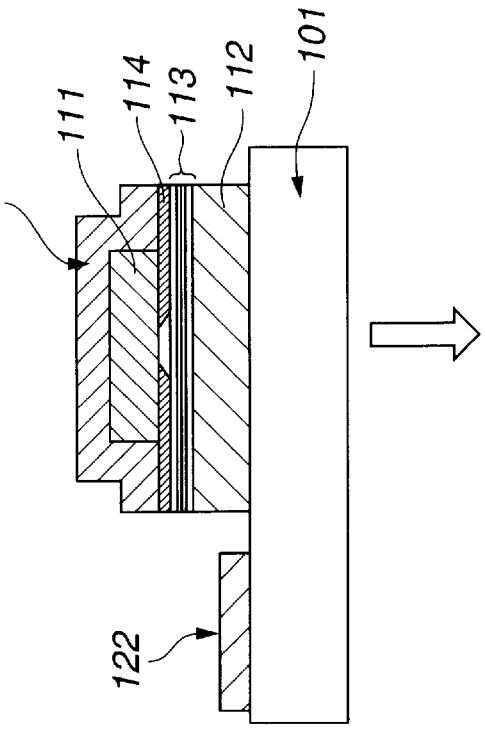
Figure 4D:
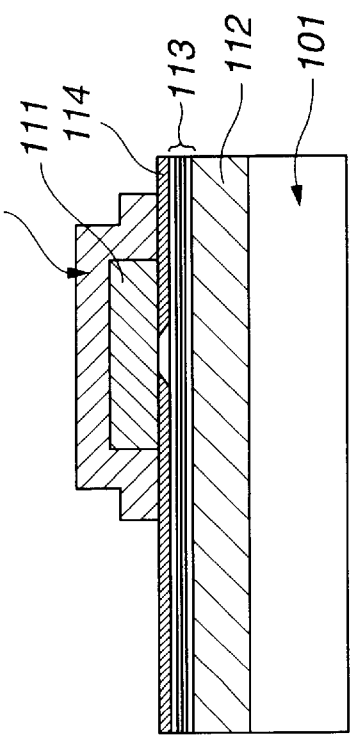

Further, AlAs selective oxidization layer 114, InGaAs/GaAs active region 113, and n-type GaAs/AlGaAs multi-layer mirror 112 are etched until the n-type GaAs substrate 101 is exposed, as illustrated in FIG. 4C. The etching may be stopped at a halfway point of the multi-layer mirror 112. When the semi-insulating substrate is used as the substrate 101, the etching must be stopped at the halfway point of the multi-layer mirror 112. The RIBE using fluorine gas is employed as the etching method.

The cathode electrode 122 is then formed on a portion of the n-type GaAs substrate 101 (or on the multi-layer mirror 112) exposed during the process of FIG. 4C. The cathode electrode 122 is formed of AuGe/Au.

In the above structure, compositions of the active region 113 and the multi-layer mirrors 111 and 112 can also be altered as described in the first embodiment.

A current injection can be attained by using only one face of the device in the third embodiment, while both opposite faces of the device need be used in the first and second embodiments when the laser is driven. Therefore, electric wiring can be readily arranged for the laser of the third embodiment.

In the above structure of the third embodiment, like the first embodiment, the anode electrode 121 formed on the p-type mirror 111 also has the function of a metal mirror. Thereby, the layer number of the p-type multi-layer mirror 111 can be reduced. Therefore, the serial electrical resistance of the device is lowered, and the electric power consumption can be hence reduced. The serial resistance can be further reduced since a current can be injected through the sides of the mesa of the p-type multi-layer mirror 111 as well as its top. Additionally, the thermal conductivity is enhanced by the metal electrode 121 covering the top and sides of the p-type multi-layer mirror 111. The thermal characteristics of the device are thus improved.

Fourth Embodiment

FIG. 5 illustrates a cross-section of a fourth embodiment of an array of surface emitting semiconductor lasers of the present invention. Also in FIG. 5, portions having the same function as those in FIG. 2 are designated by the same reference numerals as those in FIG. 2.

The laser of the fourth embodiment is fabricated in the following manner.

Similarly to the first embodiment, n-type GaAs/AlGaAs multi-layer mirror 112, InGaAs/GaAs active region 113, AlAs selective oxidization layer 114, and p-type GaAs/AlGaAs multi-layer mirror 111 are grown on the n-type GaAs substrate 101 in this order by MBE, as illustrated in FIG. 5. Then, surface emitting semiconductor lasers having the structure of the first embodiment are arrayed using the same fabrication process as that of the second embodiment. This array structure is bonded to gold wiring 202 formed on a heat sink 201 on the side of the anode electrode 121.

In the structure of the fourth embodiment, the laser array is bonded to the heat sink 201. Accordingly, the heat radiation efficiency is further improved, and the thermal conductivity is enhanced more than the laser array of the second embodiment. Thus, a surface emitting laser array with excellent thermal characteristics can be achieved. The heat sink 201 can also act as a wiring substrate for devices. In the structure of FIG. 5, the gold wiring 202 is formed on the heat sink 201, and the sink 201 is formed of aluminum nitride. The laser array and the heat sink 201 are bonded by thermal compressive bonding between the gold electrode 121 and the gold wiring 202.

In the fourth embodiment, the heat radiation efficiency is improved by using the surface emitting laser of the present invention, and therefore, the array structure of surface emitting lasers can be fabricated with higher density and narrower intervals between lasers than a conventional semiconductor laser array. Further, power consumption per each device is reduced, and a large number of surface emitting lasers can be hence integrated.

An air gap 210 between the heat sink 201 and the laser may be filled with a material, such as polyimide, to enhance the strength of the structure. The material of the heat sink 201 is not limited to the above aluminum nitride. The bonding between the laser array and the heat sink 201 is also not limited to the above thermal compressive bonding.

Fifth Embodiment

Figure 6:
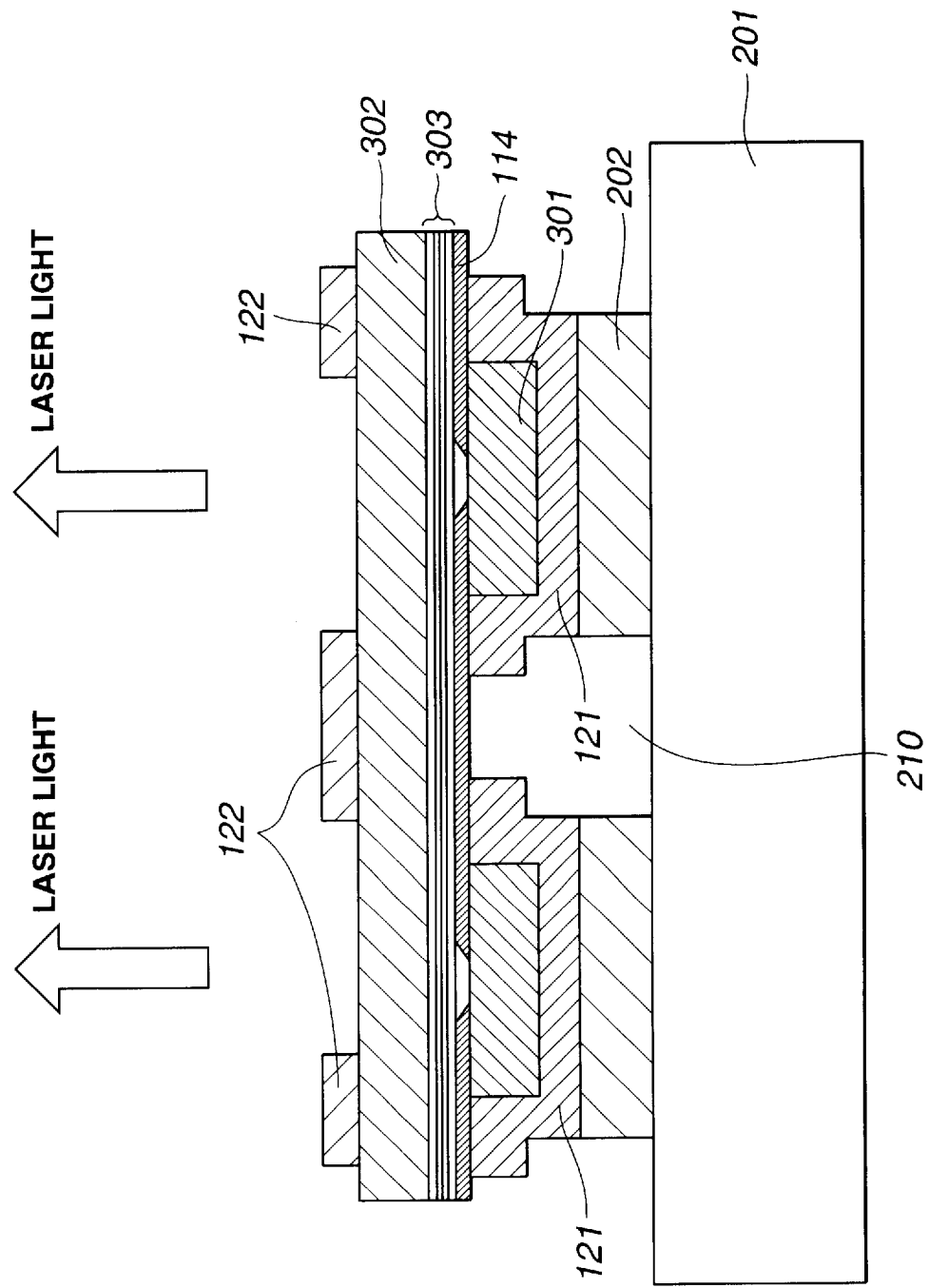
FIG. 6 is a cross-sectional view taken along a cavity extending direction, illustrating a fifth embodiment of an array of surface emitting semiconductor lasers according to the present invention.

FIG. 6 illustrates a cross-section of a fifth embodiment of an array of surface emitting semiconductor lasers of the present invention. Also in FIG. 6, portions having the same function as those in FIG. 2 are designated by the same reference numerals as those in FIG. 2.

The laser array of the fifth embodiment is fabricated in the following manner.

An n-type AlAs/AlGaAs multi-layer mirror 302, an AlGaAs/GaAs active region 303, an AlAs selective oxidization layer 114, and a p-type AlAs/AlGaAs multi-layer mirror 301 are grown on the n-type GaAs substrate 101 (not shown in FIG. 6) in this order by MBE. Then, surface emitting semiconductor lasers are arrayed using the same fabrication process as that of the second embodiment. This array structure is bonded to the gold wiring 202 formed on the heat sink 201 on the side of the anode electrode 121. At this stage of the process, the n-type GaAs substrate 101 is removed, and the cathode electrode 122 is formed on the thus-exposed n-type AlAs/AlGaAs multi-layer mirror 302, as illustrated in FIG. 6.

In the structure of the fifth embodiment, the laser array is bonded to the heat sink 201. Accordingly, the heat radiation efficiency is further improved. The heat sink 201 can also act as a wiring substrate for devices. Also in the structure of FIG. 6, the gold wiring 202 is formed on the heat sink 201, and the sink 201 is formed of aluminum nitride. The laser array and the heat sink 201 are bonded by thermal compressive bonding.

Thus, the same effects as those of the fourth embodiment are obtained in the fifth embodiment.

Like the fourth embodiment, the air gap 210 between the heat sink 201 and the laser may be filled with a material, such as polyimide, to enhance the strength of the structure.

In the fifth embodiment, the oscillation wavelength of the surface emitting laser is 0.83 $\mu$m. Therefore, the cathode electrode 122 is formed after the n-type GaAs substrate 101 is entirely or partially removed as illustrated in FIG. 6. The removal of the GaAs substrate 101 is conducted after the wafer is bonded to the heat sink 201. The GaAs substrate 101 can be removed by chemical mechanical polishing (CMP), wet etching, or the like. Alternatively, when an AlGaAs substrate transparent to a wavelength of 0.83 $\mu$m is employed in place of the n-type GaAs substrate 101, the substrate need not be removed. When the n-type GaAs substrate 101 is removed, the cathode electrode 122 can act as a heat sink as well. Thus, the heat radiation characteristic of this embodiment is further increased.

Sixth Embodiment

In the following embodiments, the selective oxidization layer of an $Al_xGa_{1-x}As$ layer (typically $0.8 \leq x \leq 1$) is used as an etch stop layer after it is oxidized, since it is difficult to use the selective oxidization layer (this is not yet oxidized) as an etch stop layer. Thus, a surface emitting semiconductor laser with a built-in current confinement structure of a sixth embodiment is improved in its fabrication yield.

FIG. 7 illustrates a cross-section of the sixth embodiment of the surface emitting semiconductor laser of the present invention. The laser of FIG. 7 includes an active region 513, a p-type semiconductor multi-layer mirror 511, and an n-type semiconductor multi-layer mirror 512. The laser is designed to emit laser light from the side of p-type semiconductor multi-layer mirror 511. The active region 513 consists of a multiple quantum well structure of InGaAs/GaAs and has an oscillation spectrum with a peak near a wavelength of 0.98 μm. The p-type and n-type semiconductor multi-layer mirrors 511 and 512 are composed of layer structures of GaAs/AlGaAs, the thickness of each of which is a quarter of the oscillation wavelength, respectively. Their reflection factors are about 99.9%.

A method of fabricating the 0.98 μm-wavelength surface emitting laser will be described. The n-type GaAs/AlGaAs multi-layer mirror 512, InGaAs/GaAs multi-quantum well active region 513, current confinement layer of the AlAs selective oxidization layer 514, and p-type GaAs/AlGaAs multi-layer mirror 511 are grown in this order on an n-type GaAs substrate 501 by MBE. The current confinement layer 514 is grown such that its Al mole fraction is gradually altered from $Al_xGa_{1-x}As$ (lowermost portion) to AlAs (uppermost portion).

A groove 530 for oxidizing the current confinement layer 514 is then formed by etching the wafer from the p-type multi-layer mirror 511 down to a halfway or top point of the n-type multi-layer mirror 512. RIBE using fluorine gas and a photoresist mask is employed here.

The $Al_xGa_{1-x}As$ ($0.8 \leq x \leq 1$) layer is heated and partially oxidized into $Al_2O_3$ in a water vapor atmosphere to form the current confinement layer 514 of the selective oxidization layer. The current confinement layer 514 acts to locally increase the current density in the active region 513, and thus reduces the threshold current. Here, the Al mole fraction of the current confinement layer 514 is gradually changed perpendicularly to the n-type semiconductor substrate 501, so that an oxidized portion of the current confinement layer 514 is tapered. Accordingly, the refractive index of the layer 514 is also sloped, and the layer can act as a kind of lens. The light density is hence enhanced in the active region 513, and the threshold current is further reduced.

In this embodiment, the current confinement layer 514 is oxidized before use as an etch stop layer. Accordingly, the oxidization width for current confinement can be accurately controlled. When oxidization is performed after the layer 514 is used as an etch stop layer, the layer 514 is likely to be slightly etched. Therefore, there is a small concern that the oxidization width in the in-plane direction might not be sufficiently accurately controlled since the etching depth of the layer 514 differs per lot.

The mesa is then formed by etching the p-type multi-layer mirror 511 with the selective oxidization layer (current confinement layer) 514 already oxidized as above being used as an etch stop layer. RIBE using fluorine gas and a photoresist mask is employed here. Pieces of the mirror 511 are left outside the mesa of the multi-layer mirror 511 as illustrated in FIG. 7, but these only remain for the convenience of the fabrication process during which the resist mask cannot be cut exactly at the edge of the groove 530 (in this connection, see FIG. 8C).

Electrodes are then formed by the EB deposition. An anode electrode 521 is formed of Cr/Au, and a cathode electrode 522 is formed of AuGe/Ni/Au. The lift-off method is used in the process of forming the electrode. The thickness of the electrode may be increased by electrical plating such that the heat radiation characteristic can be sufficiently improved.

The current confinement layer 514 is partially exposed since the etching is performed with the layer 514 being used as an etch stop layer. Therefore, the layer 514 can also act as an insulating layer which does not directly electrically connect the anode 521 to the active region 513 or n-type multi-layer mirror 512. The anode 521 can be hence shaped into such a configuration as illustrated in FIG. 7 that permits a current injection through the sides of the mesa of the p-type multi-layer mirror 511. Thus, the serial electrical resistance is further reduced. Additionally, the thermal resistance is decreased due to the covering of the top and sides of the p-type multi-layer mirror 511 with the metal electrode 521, and the thermal characteristic of the device is thus improved.

The structure illustrated in FIG. 7 is constructed such that a 0.98 μm-wavelength surface emitting laser is achieved. It is possible, however, to achieve a 0.83 μm-wavelength surface emitting laser or the like by altering the composition of the active region 513, for example.

Also in the above fabrication process of this embodiment, the growth method is not limited to MBE, but a chemical beam growth method or the like can also be used. Further, GaAs-series material is used as the above material, but the material is not limited thereto, either.

The distribution of the Al mole fraction in the selective oxidization layer 514 is also not limited to a gradual slope, but it can vary.

Regarding the etching, RIBE using fluorine gas is used in the above fabrication method, but other etching methods may be used. Wet etching using a mixed solution of citric acid and hydrogen peroxide can be used, for example. Further, oxidization of the AlAs selective oxidization layer 514 can be likewise conducted by dipping the wafer into a hydrogen peroxide solution, for example.

With respect to the electrodes, these are formed by EB vapor deposition in the above fabrication method, but vapor deposition using resistance heating or the like can also be used. Further, the electrode may be formed of Ti/Au, Ti/Pt/Au, Pt/Au, or the like. The lift-off method is used as the process of forming the electrode, but the forming process is not limited thereto.

Seventh Embodiment

FIGS. 8A to 8D illustrate a fabrication process of a seventh embodiment of a surface emitting semiconductor laser of the present invention. In FIGS. 8A to 8D, portions having the same function as those in FIG. 7 are designated by the same reference numerals as those in FIG. 7.

In the seventh embodiment, a surface emitting semiconductor laser includes active region 513, p-type semiconductor multi-layer mirror 511, and n-type semiconductor multi-layer mirror 512. The laser is designed to emit laser light from the side of n-type semiconductor multi-layer mirror 512. The active region 513 consists of a multiple quantum well structure of InGaAs/GaAs and has an oscillation spectrum with a peak near a wavelength of 0.98 μm. The p-type and n-type semiconductor multi-layer mirrors 511 and 512 are composed of layer structures of GaAs/AlGaAs, the thickness of each of which is a quarter of the oscillation wavelength, respectively. Their reflection factors are about 99.9%.

A method of fabricating the 0.98 μm-wavelength surface emitting laser will be described. The n-type GaAs/AlGaAs multi-layer mirror 512, InGaAs/GaAs multiple quantum well active region 513, current confinement layer of the selective oxidization layer 514, and p-type GaAs/AlGaAs multi-layer mirror 511 are grown in this order on the n-type GaAs substrate 501 by MBE. The current confinement layer 514 is grown such that its Al mole fraction is gradually altered from $Al_{0.8}Ga_{0.2}As$ (lowermost portion) to AlAs (uppermost portion).

Figure 8A:
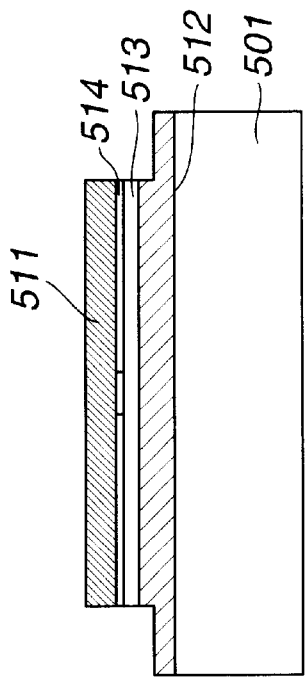
FIGS. 8A to 8D are cross-sectional views taken along a cavity extending direction, illustrating a process of fabricating a seventh embodiment of a surface emitting semiconductor laser according to the present invention.

The groove 530 for selectively oxidizing the current confinement layer 514 is then formed by etching the wafer from the p-type multi-layer mirror 511 down to a halfway portion or top of the n-type multi-layer mirror 512, as illustrated in FIG. 8A. RIBE using fluorine gas and a photoresist mask is employed here.

Figure 8B:
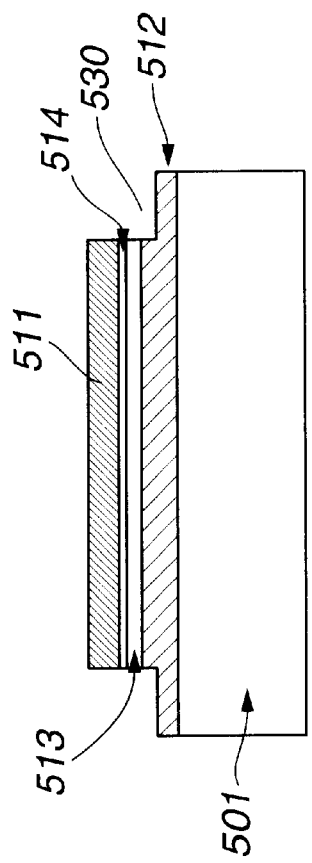

The $Al_xGa_{1-x}As$ ($0.8 \leq x \leq 1$) layer is heated and partially oxidized into $Al_2O_3$ in a water vapor atmosphere to form the current confinement layer 514 of the selective oxidation layer, as illustrated in FIG. 8B. The current confinement layer 514 acts to locally increase the current density, and thus enhances the efficiency of the device. Here, the Al mole fraction of the current confinement layer 514 is gradually changed perpendicularly to the n-type semiconductor substrate 501, so that an oxidized portion of the current confinement layer 514 is tapered. Accordingly, the refractive index of the layer 514 is also sloped, and the current confinement layer 514 can act as a kind of lens. The light density is hence enhanced locally in the active region 513, and the threshold current is further reduced.

Figure 8C:
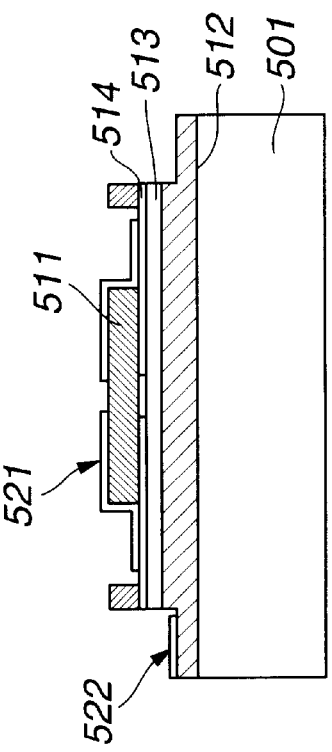

Then, the mesa is formed by etching the p-type multi-layer mirror 511 with the selective oxidization layer (current confinement layer) 514 being used as an etch stop layer, as illustrated in FIG. 8C. Reactive ion beam etching (RIBE) using fluorine gas and a photoresist mask 550 is employed here.

Figure 8D:
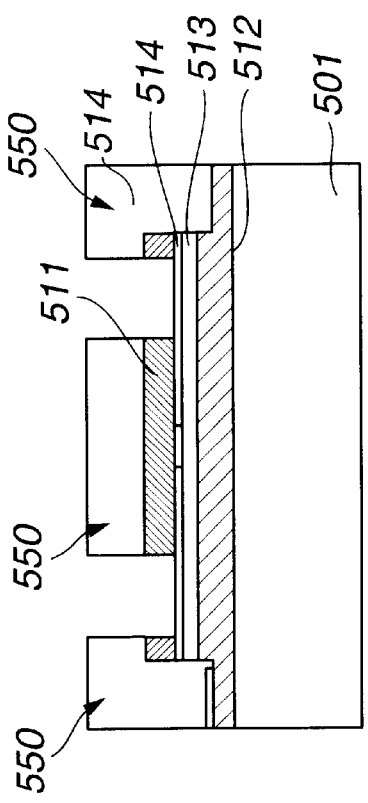

Electrodes are then formed by EB deposition, as illustrated in FIG. 8D. The anode electrode 521 deposited on the p-type multi-layer mirror 511 is formed of Cr/Au, and the cathode electrode 522 deposited on the exposed n-type multi-layer mirror 512 is formed of AuGe/Ni/Au. The lift-off method is used in the process of forming the electrode. The thickness of the electrode may be increased by electrical plating such that the heat radiation characteristic can be sufficiently improved.

The etching is conducted with the partially-oxidized current confinement layer 514 being used as an etch stop layer. Therefore, the layer 514 is exposed and can also act as an insulating layer which does not directly electrically connect the anode 521 to the active region 513 or n-type multi-layer mirror 512. The anode 521 can be hence shaped into such a configuration as illustrated in FIG. 8D that permits a current injection through the sides of the mesa of the p-type multi-layer mirror 511 as well. Thus, the serial electrical resistance can be further reduced. Additionally, the thermal resistance is decreased due to the covering of the top and sides of the p-type multi-layer mirror 511 with the metal electrode, and the thermal characteristic of the device can be thus improved.

The structure of this embodiment is also constructed such that a 0.98 µm-wavelength surface emitting laser can be achieved. It is possible, however, to achieve a 0.83 µm-wavelength surface emitting laser or the like, which is adaptable to a wide wavelength band, by altering the composition of the active region 513 or by removing the n-type semiconductor substrate 501, for example.

In the above fabrication process, the growth method is not limited to MBE, but a chemical beam growth method or the like can also be used. Further, GaAs-series material is used as the above material, but the material is not limited thereto.

The distribution of the Al mole fraction in the selective oxidization layer 514 is also not limited to a monotonous slope, and it can vary.

The etching, electrode material and so forth can also be modified as discussed in the sixth embodiment.

In the sixth embodiment, both opposite faces of the laser are used to inject a current into the laser when the surface emitting laser is driven. In contrast, in the seventh embodiment with the structure illustrated in FIG. 8D, a current can be injected into the device using a single face. Therefore, electric wiring can be simply arranged toward the surface emitting laser of this embodiment.

Eighth Embodiment

Figure 9:
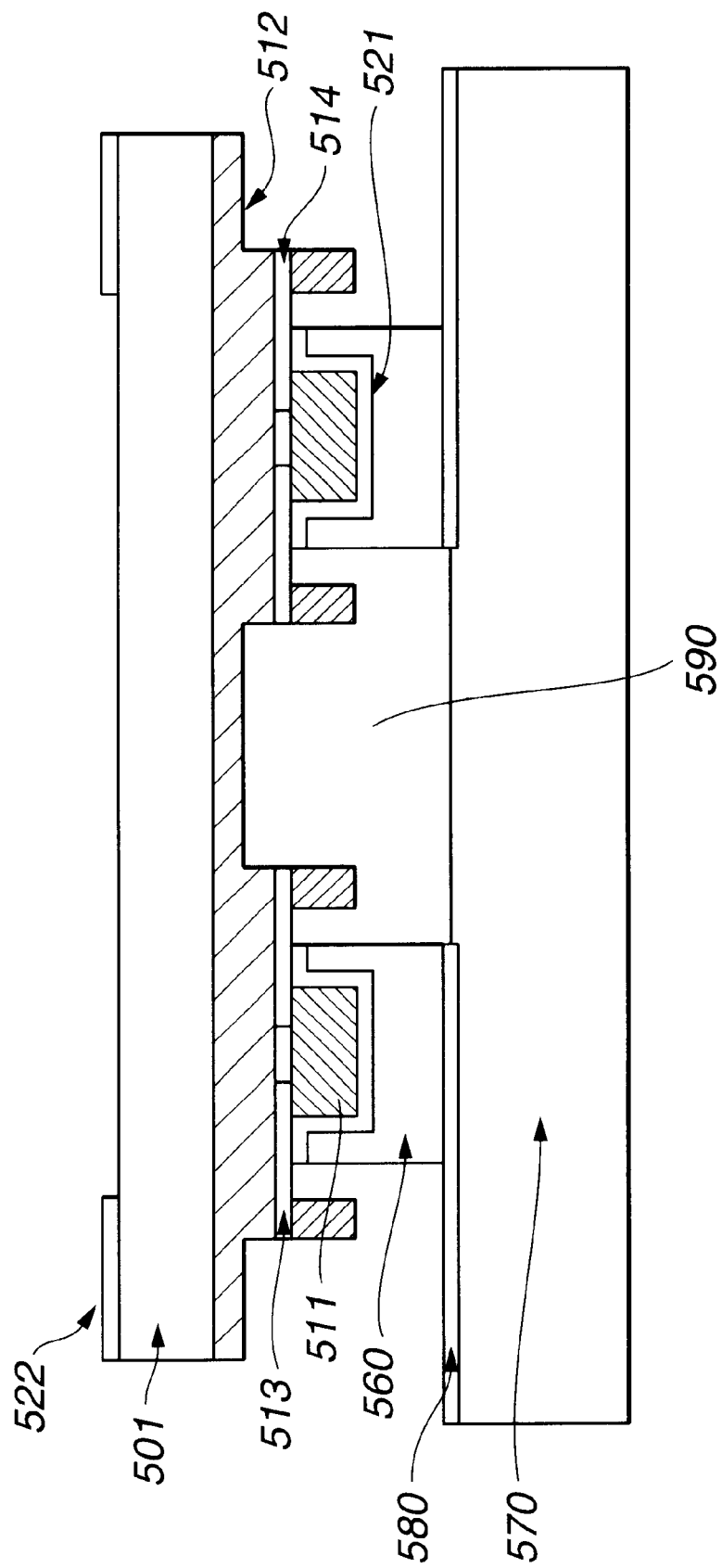
FIG. 9 is a cross-sectional view taken along a cavity extending direction, illustrating an eighth embodiment of an array of surface emitting semiconductor lasers according to the present invention.

FIG. 9 illustrates a cross-section of an eighth embodiment of an array of surface emitting semiconductor lasers of the present invention. Also in FIG. 9, portions having the same function as those in FIG. 7 are designated by the same reference numerals as those in FIG. 7.

The laser of the eighth embodiment is fabricated in the following manner.

The laser array illustrated in FIG. 9 adopts surface emitting lasers of the seventh embodiment, with the exception that the cathode 522 is formed on the bottom of the n-type semiconductor substrate 501. In the laser array of FIG. 9, the laser structure of the present invention is used to improve the heat radiation efficiency. Therefore, an array structure of surface emitting lasers can be fabricated with higher density and narrower intervals between lasers than a conventional semiconductor laser array. Further, electric power consumption per device is reduced, and hence a large number of surface emitting lasers can be integrated.

A gold plated layer 560 is formed on the anode 521. Accordingly, the heat radiation efficiency is further improved, and a surface emitting laser array with excellent thermal characteristics can be achieved. Further, when implementation is conducted using an eutectic solder, such as AuSn, the gold plated layer 560 serves to reduce intrusion of the eutectic solder into the anode 521. Thus, reliability of the implementation is improved.

In the structure of the eighth embodiment, the laser array is bonded to a heat sink 570. Accordingly, the heat radiation efficiency is further improved. The heat sink 570 can also act as a wiring substrate for devices. In the structure of FIG. 9, gold electric wiring 580 is formed on the heat sink 570, and the sink 570 is formed of aluminum nitride. The laser array and the heat sink 570 are bonded by thermal compressive bonding.

The structure of this embodiment is also constructed such that a 0.98 µm-wavelength surface emitting laser can be achieved. It is possible, however, to achieve a 0.83 µm-wavelength surface emitting laser or the like by altering the composition of the active region 513, by entirely or partially removing the n-type semiconductor substrate 501, or by using a transparent substrate (formed of AlGaAs, for example).

An air gap 590 between the heat sink 570 and the laser array may be filled with a material, such as polyimide, to enhance the strength of the structure. The material of the heat sink 570 is not limited to the above aluminum nitride. Silicon (Si), diamond, copper (Cu), or the like can be used as well. The bonding between the laser array and the heat sink 570 is also not limited to the above thermal compressive bonding.

Ninth Embodiment

Figure 10:
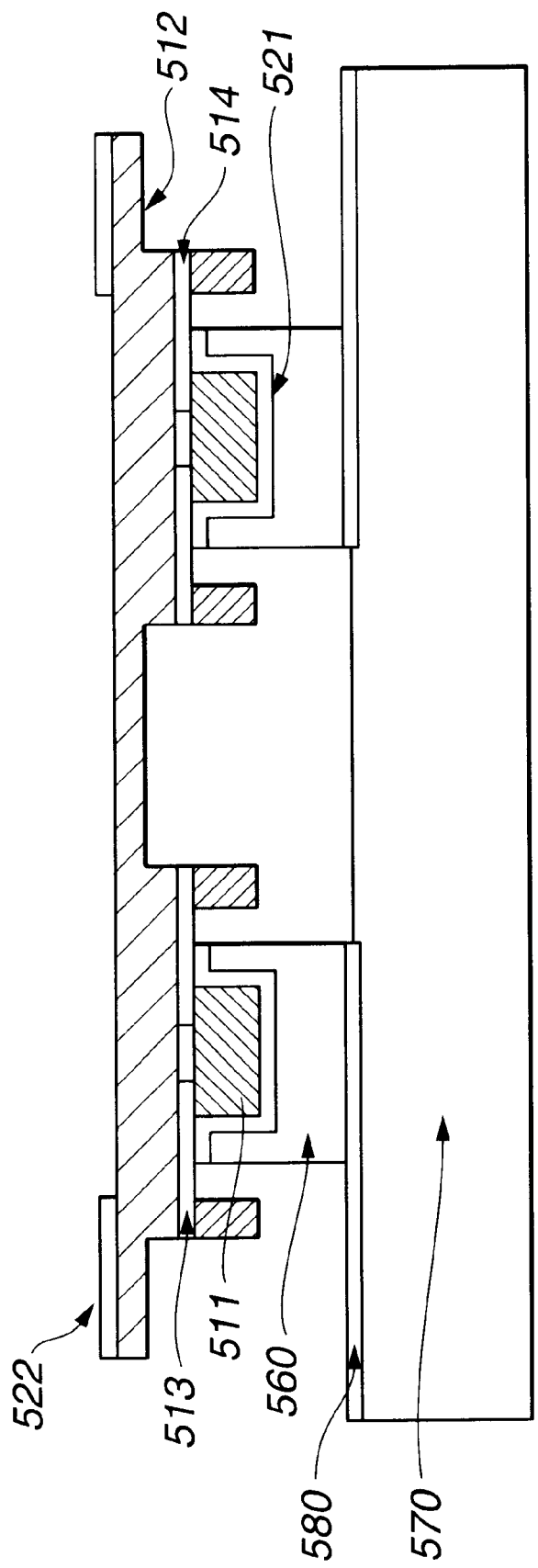
FIG. 10 is a cross-sectional view taken along a cavity extending direction, illustrating a ninth embodiment of an array of surface emitting semiconductor lasers according to the present invention.

FIG. 10 illustrates a cross-section of a ninth embodiment of an array of surface emitting semiconductor lasers of the present invention. Also in FIG. 10, portions having the same function as those in FIG. 7 are designated by the same reference numerals as those in FIG. 7.

In the ninth embodiment, the n-type semiconductor substrate 501 of the laser array fabricated by the fabrication method of the eighth embodiment is entirely removed. A thermal path between the devices is narrowed due to the removal of the n-type substrate 501, and thermal cross-talk can be reduced. Further, the series electrical resistance of the surface emitting laser can be decreased thereby. Additionally, the cathode 522 is located close to the active region 513, and hence the cathode 522 can also act as a heat sink. Thus, the heat radiation characteristic is further improved.

In the ninth embodiment, the cathode electrode 522 is formed after the n-type semiconductor substrate 501 is entirely or partially removed. The removal of the substrate 501 is effected after the wafer is bonded to the heat sink 570. The substrate 501 can be removed by CMP or wet etching.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A surface emitting semiconductor laser comprising:
   a substrate;
   an active region formed on said substrate;
   a layer formed on said active region;
   a mirror region formed on said layer; and
   an electrode formed on a side and a top of said mirror region,
   wherein said mirror region has a mesa shape,
   wherein said layer is partially oxidized and has a current confinement structure, and
   wherein said surface emitting semiconductor laser emits light from the active region toward the substrate.

2. The surface emitting semiconductor laser according to claim 1, wherein said layer is composed of semiconductor including aluminum which is selectively oxidized.

3. The surface emitting semiconductor laser according to claim 2, wherein said layer is composed of $Al_xGa_{1-x}As$ ($0.8 \leq x \leq 1$) which is selectively oxidized.

4. The surface emitting semiconductor laser according to claim 2, wherein an Al mole fraction of said layer changes along a direction perpendicular to the substrate.

5. The surface emitting semiconductor laser according to claim 1, wherein the substrate is entirely or partially removed.

6. The surface emitting semiconductor laser according to claim 1, wherein said mirror region is composed of semiconductor multi-layer mirrors.

7. The surface emitting semiconductor laser according to claim 1, wherein a metal mirror region is formed between said substrate and said active region.

8. The surface emitting semiconductor laser according to claim 1, wherein said active region comprises a quantum well semiconductor layer.

9. The surface emitting semiconductor laser according to claim 1, wherein a plurality of surface emitting semiconductor lasers are arrayed on said substrate.

10. The surface emitting semiconductor laser according to claim 1, further comprising a plurality of adjacent laser transmitting parts provided in a row, wherein said layer serves as an insulating layer for electrically insulating the adjacent laser transmitting parts from each other.

11. The surface emitting semiconductor laser according to claim 1 further comprising a heat sink on which said surface emitting semiconductor laser is bonded.

12. The surface emitting semiconductor laser according to claim 11, wherein said surface emitting semiconductor laser is bonded on said heat sink with said mirror region being on the side of said heat sink.

13. The surface emitting semiconductor laser according to claim 1, wherein all of said layer is oxidized except for a center portion of said layer, said center portion functioning as a current path.

* * * * *